(12) United States Patent
Utsunomiya

(10) Patent No.: US 6,795,603 B2
(45) Date of Patent: Sep. 21, 2004

(54) OPTICAL SWITCH

(75) Inventor: Motoyasu Utsunomiya, Tokyo (JP)

(73) Assignee: NEC Corporation, Tokyo (JP)

( * ) Notice: Subject to any disclaimer, the term of this patent is extended or adjusted under 35 U.S.C. 154(b) by 155 days.

(21) Appl. No.: 10/195,741

(22) Filed: Jul. 16, 2002

(65) Prior Publication Data

US 2003/0016906 A1 Jan. 23, 2003

(30) Foreign Application Priority Data

Jul. 18, 2001 (JP) ........................................ 2001-218447

(51) Int. Cl.[7] ............................. G02B 6/35; G02F 1/295
(52) U.S. Cl. ............................................. 385/18; 385/8
(58) Field of Search ........................... 385/15, 16, 17, 385/18, 19, 8, 14, 24, 25; 359/198, 199, 196, 223, 224, 237, 290, 291, 838, 855, 850, 872, 900, 270, 278, 871, 873, 874, 875, 876, 877, 221, 225

(56) References Cited

U.S. PATENT DOCUMENTS

| | | | | |
|---|---|---|---|---|
| 5,661,591 A | * | 8/1997 | Lin et al. ..................... | 359/290 |
| 5,867,297 A | * | 2/1999 | Kiang et al. ................. | 359/198 |
| 6,253,001 B1 | * | 6/2001 | Hoen ........................... | 385/17 |
| 6,318,871 B1 | * | 11/2001 | Hagelin ........................ | 359/872 |
| 6,337,760 B1 | * | 1/2002 | Huibers et al. ............. | 359/291 |
| 6,483,962 B1 | * | 11/2002 | Novotny ...................... | 385/18 |
| 6,585,383 B2 | * | 7/2003 | Helkey ........................ | 359/871 |
| 6,597,827 B1 | * | 7/2003 | Brener et al. ................. | 385/18 |
| 6,600,851 B2 | * | 7/2003 | Aksyuk et al. ................ | 385/18 |
| 6,657,759 B2 | * | 12/2003 | Muller ........................ | 359/198 |
| 6,657,771 B2 | * | 12/2003 | Okayama ..................... | 359/290 |
| 6,681,063 B1 | * | 1/2004 | Kane et al. .................... | 385/18 |
| 6,717,325 B2 | * | 4/2004 | Fernandez et al. .......... | 359/223 |
| 2003/0007226 A1 | * | 1/2003 | Buzzetta ..................... | 359/225 |
| 2003/0007235 A1 | * | 1/2003 | Yoon .......................... | 359/290 |
| 2003/0012488 A1 | * | 1/2003 | Staple et al. .................. | 385/18 |
| 2003/0103717 A1 | * | 6/2003 | Aksyuk et al. ............... | 385/18 |

OTHER PUBLICATIONS

Fusao Shimokawa et al., "Micro-mechanical Optical Switch", NTT R&D vol. 48, No. 9, 1999 (issued by NTT Group's Research and Development Activity).

* cited by examiner

*Primary Examiner*—John R. Lee
*Assistant Examiner*—James P. Hughes
(74) *Attorney, Agent, or Firm*—Young & Thompson

(57) ABSTRACT

An analog beam-steering free-space optical switch for connecting and switching a plurality of optical signals includes a plurality of optical devices and electrostatic actuators for driving the optical devices. Each optical device is pivotally borne so as to allow rotation around a prescribed center of rotation, and each electrostatic actuator includes the substrate that holds the optical devices and a plurality of driving electrodes that are secured to the substrate. The application of electrostatic voltage between an optical device and the driving electrodes generates electrostatic driving torque for causing the optical device to tilt with respect to the substrate around the center of rotation, whereby the direction of reflection of an optical signal is changed. The plurality of driving electrodes are arranged in a radial pattern relative to the electrode center.

14 Claims, 10 Drawing Sheets

1 × 2 Switch
(a)

1 × 2 Switch

1 × 8 Switch

N × M Switch
(b)

(a)　　　　　(b)

OPTICAL SWITCH

BACKGROUND OF THE INVENTION

The present invention relates to an optical cross-connect for connecting and switching optical paths of a plurality of optical signals in an optical communication system, and more particularly to an analog beam-steering free-space optical switch that is constructed using micro-machining technology.

The development of the "Information Society" is advancing the development and deployment of optical communication systems that enable high-capacity information transfer. To meet the increasing demands of communication, this type of optical communication system employs Wavelength Division Multiplexing (WDM) transmission technology in which signals of different wavelengths are superposed on a single optical fiber for transmission and reception. In addition to a Point-to-Point mode in which communication between two points is joined using optical multiplexer/demultiplexers, this transmission technology introduces an Add-Drop mode for adding and dropping specific wavelengths at relay stations.

In order to implement this type of communication system, a light source adapted for high-speed modulation, optical fiber for high-capacity transmission, broadband fiber amplifiers, and multi-channel wavelength filters are indispensable. Of these components, optical switches that can selectively switch optical signals of any wavelength from a plurality of input ports and connect the optical signals to prescribed output ports is an important key technology for flexibly handling constantly changing communication demands as well as for coping with failures in communication lines.

On the other hand, the conversion to all-optical communication in which optical signals are transmitted without conversion to electrical signals is being advanced as one way for the development of optical communication systems in order to realize lower optical communication costs, system simplification, and faster transmission rate. This communication method is directed to using, in a large-scale switch for setting optical paths, an all-optical OXC (Optical Cross-Connect) as an optical switch. The "all-optical connection" refers to the way of connecting optical paths without first converting light to electricity and then connecting the electrical transmission lines.

An all-optical optical switch requires from small-scale switches having one-input and two-output (1×2) to large-scale switches having 1000×1000 or more input and output ports.

FIG. 1(a) shows a small-scale optical switch (1×2) of the prior art, and FIG. 1(b) shows an example of hierarchically assembled small-scale optical switches. The small-scale optical switch is constructed using a driving circuit for mechanical connection 14, made up by a solenoid coil 11 and a permanent magnet 15, to selectively connect one input-side optical fiber 12 to either one of two output-side optical fibers 13 (NTT, R&D, Vol. 48, No. 9: 1999, pp. 665–673).

In the figure, reference numerals 16 and 17 stand for a movable fiber on the input side and static fibers on the output side, respectively. All these fibers are contained in a ferrule 18. The input and output optical fibers are externally connected through optical connectors 20.

As shown in FIG. 1(b), when using this type of small-scale optical switch, an N×M multi-input-multi-output optical switch can be constituted by hierarchically assembling a plurality of small-scale optical switches 104. Nevertheless, the hierarchically assembled switch is not suitable for a large-scale switch because optical loss increases as the number of levels in the hierarchical structure increases.

FIG. 2 shows an example of a large-scale all-optical optical switch of the prior art, FIG. 2(a) showing a schematic view of the optical switch, FIG. 2(b) showing an entire optical switch array, FIG. 2(c) showing the arrangement of optical devices that constitute a portion of the optical switch array, and FIG. 2(d) showing the constitution of each individual optical device.

The optical device shown in FIG. 2 is an example of a free-space optical cross-connect for realizing inter-fiber optical connections in which micro-actuators individually drive micromirror elements arrayed by means of MEMS technology.

The example of the prior-art optical switch shown in FIG. 2(a) is made up by input ports 19, output ports 20, and two optical switch arrays 2101 and 2102. Input ports 19 are constituted by input-side fiber array 15 that is made up by N optical fibers secured to a through-hole array (not shown in the figure) of capillary array 1701, and collimation lens array 1801. Output ports 20 are similarly constituted by: output-side fiber array 16 that is made up by M optical fibers secured to capillary array 1702, and lens array 1802.

In this device, two optical switch arrays 2101 and 2102 are constituted by two-dimensionally arranging optical switch elements (hereinbelow referred to as optical switches) 105 in matrix form, wherein the number of the optical switches corresponds to the number of input/output ports, as shown in FIGS. 2(b) and (c). Each optical switch 105 is composed of an optical device section and a micro-actuator. In FIGS. 2(c) and (d), only the optical device is shown, and the micro-actuator is not shown in the figure.

The optical device is made up by: micromirror 203; mirror frame 303 that surrounds and pivotally bears micromirror 203 to rotate (tilt) micromirror 203 around the Ry axis; and frame 703 that surrounds and pivotally bears mirror frame 303 to rotate mirror frame 303 around the Rx axis.

Under electrostatic driving torque generated by a micro-actuator (not shown in the figure), micromirror 203 is capable of both tilting around the Ry axis and tilting around the Rx axis by means of mirror frame 303 that is rotatable around the Rx axis. The optical device is thus driven by the biaxial electrostatic driving torque generated by a micro-actuator to enable steering with respect to two degrees of freedom (around the axes in the Rx and Ry directions in FIG. 2(d)). This mode of drive is hereinafter referred to as biaxial drive.

Micromirror 203 and mirror frame 303 are pivotally borne by hinge springs 503 and 603, respectively, and are thus pulled back by an elastic restoring force proportional to the angle of rotation (tilt angle). Micromirror 203 and mirror frame 303 are at rest at the angle of tilt at which the electrostatic driving torque and elastic restoring force are in equilibrium.

A laser beam incident on micromirror 203 can thus be reflected in any direction.

This switch array allows changing the optical paths of beams as described hereinbelow (analog beam steering).

As shown in FIG. 2(a), optical signals exit from input port 19 and are collimated by passage through lens array 1801. An optical signal that has been collimated is then incident on micromirror 203 of optical switch array 2101 that corresponds to the micro-lens in lens array 1801 through which the optical signal of interest has passed. The reflected beam is steered by the biaxial drive of micromirror 203 such that the reflected beam of the optical signal is directed in a prescribed direction. The optical signal, emerging from optical switch array 2101, is next incident on a prescribed micromirror of second optical switch array 2102. Biaxial drive of the micromirror of second optical switch array 2102 directs the reflected beam of the optical signal to an optical fiber of output port 20 to take out the optical signal.

FIG. 3 shows the details of the optical device of the optical switch, FIG. 3(*a*) being a plan view of an example of a biaxial-driven free-space optical switch of the optical device, and FIG. 3(*b*) being a plan view of the hinge springs.

Micromirror 203 is pivotally borne by mirror frame 303 by means of a pair of hinge springs 503, and this mirror frame 303 is similarly pivotally borne by outer frame 703 by means of a pair of hinge springs 603.

In this device, the rotational axis of micromirror 203 and the rotational axis of mirror frame 303 are set in mutually orthogonal directions, and a reflected beam is steered two-dimensionally by independently driving around the two axes. The hinge springs may be of any shape to obtain a prescribed stiffness, and in this example, a serpentine or continuous fanfold shape (refer to FIG. 3(*b*)) has been adopted.

Two sets of electrode pairs 903 and 1003 are arranged orthogonally on the surface area of substrate 1102 that confronts micromirror 203. The area is hereinbelow referred to as the electrode region. These electrodes 903 and 1003 have substantially square shapes, and in combination with the grounded optical device (micromirror 203), constitute an electrostatic driving micro-actuator. The application of electrostatic force, which is controlled by controlling the applied voltage, causes micromirror 203 and mirror frame 303 to rotate around their respective axes.

FIG. 4 shows the principles of operation of the electrostatic drive. FIG. 4(*a*) shows a sectional view of micromirror 203 in a state in which electrode pair 903 is at the ground potential and no torque is applied to micromirror 203. As was explained with reference to FIG. 2 and FIG. 3, micromirror 203 is borne by mirror frame 303 by way of hinge springs 503, and mirror frame 303 is attached to frame 703 by way of hinge springs 603.

FIG. 4(*b*) shows a sectional view of the state in which voltage is applied to electrode pair 903 to apply torque to micromirror 203 and cause micromirror 203 to tilt. FIG. 4(*c*) is a side view showing the state in which both mirror 203 and mirror frame 303 are tilted around the respective axes when voltages are applied to both of the orthogonally arranged two pairs of electrodes.

In another prior art technology, it is proposed that optical paths can be constituted in planar form on the optical cross-connect and the mirror rises when the control signal is ON and falls when the control signal is OFF (digital crossbar system). This optical cross-connect is advantageous because it can be operated by simple digital control, it facilitates positioning of the input and output optical fibers, and further, it facilitates integration. However, it is disadvantageous because N×N connections necessitate $N^2$ switch elements while analog beam steering necessitates 2N switch elements, and moreover, because large optical path differences result in an increase in loss. As a result, the application of this method to large-scale switch is considered problematic.

Basically, the communication capacity in an optical communication system is determined by the product of the transmission rate per channel and number of channels. It can therefore be presumed that there will be a growing demand for achieving a high transmission rate and increasing the number of channels. Research into large-scale all-optical optical switches is therefore anticipated.

Of large-scale all-optical optical switches, analog beam-steering free-space optical switches are regarded as promising for realizing a compact, low-cost large-scale switch capable of, to some degree, suppressing optical loss. Such optical switches have been announced by Lucent Technologies or χ ros (Now owned by Nortel).

In an analog beam-steering free-space optical switch of large scale, the number of employed micromirrors is large and the angle of steering of the micromirror therefore needs increasing as the number of input/output ports increases. In order to increase the steering angle of the micromirror, it is required to extend the range of the angle within which controlled steering of a micromirror is permitted.

As another method of extending the range of steering control, it has been proposed to increase the distance between the input/output ports and mirrors and also the distance between the two optical switch arrays so that the length of the optical path through free space elongates. This method offers an advantage that mirror tilt of a small angle can achieve a desired change in the direction of the optical signal. The method, however, entails the problems that the attendant enlargement of the beam radius not only causes eclipse in the mirror which causes optical loss, but also results in an increase in size of the optical switches and the module overall.

Thus, ensuring sufficiently large mirror tilt angle is a key point in constructing a large-scale optical switch having small size and low loss.

In the case of using an electrostatic actuator to drive the micromirror, however, a problem has been that the mirror tilt angle is limited by the driving torque characteristic.

FIG. 5 shows a simple analysis model that takes as an example a single-axis rotating mirror driven by an electrostatic actuator. In this example, the driving torque generated by electrostatic force can be represented by the following formula.

$$a = r\theta = \left(\frac{d}{\sin\theta} - x\right)\theta \tag{1}$$

$$E = \frac{V}{a} = \frac{V}{\left\{\left(\frac{d}{\sin\theta} - x\right)\theta\right\}} \tag{2}$$

$$T_e = \int_{L1}^{L2} \frac{1}{2}\varepsilon_0 W E^2 x\,dx = \frac{1}{2}\varepsilon_0 W V^2 \int_{L1}^{L2} \frac{x}{\left\{\left(\frac{d}{\sin\theta} - x\right)\theta\right\}^2}\,dx \tag{3}$$

Here, E is the electric field, V is the applied voltage, W is the electrode width (width in a direction perpendicular to the plane of the figure), θ is the mirror tilt angle, L1 and L2 are the positions of the two ends of the electrode, $\varepsilon_0$ is the dielectric constant of a vacuum, d is the distance between the micromirror and the electrode when E=0, and α is the distance between a micromirror position x and the electrode when the mirror tilt angle is θ. In the following description, the distances a and d between the micromirror and the electrode are referred to as the "air gap."

FIG. 6 shows the torque characteristic curve that represents the dependency of the electrostatic driving torque (Te) upon the mirror tilt angle. The curve was calculated based on the above formulas. In this example, calculations were carried out with the electrostatic width W set to 150 μm, the electrode length L set to 150 μm (L1=80 μm and L2=230 μm), the air gap d set to 50 μm, and the applied voltage V set to 150 V.

With these settings, the hinge spring characteristic curve that represents the elastic restoring force Kθ for a tilt angle θ (where K is the stiffness of the hinge spring) is a straight line that passes through the origin and is tangent to the torque characteristic curve. The tilt angle at the point of contact $\theta_{MAX}$ is the maximum steering angle within the range of tilt angles in which stable angle positioning is possible, as will be explained hereinbelow.

When the micromirror tilts and the hinge springs are deformed, an elastic restoring force Kθ proportional to tilt angle acts on the micromirror, as shown by the hinge spring characteristic line or the restoring line (straight line) of FIG. 6.

The torque characteristic curve intersects the hinge spring characteristic line at two points if the applied voltage is low. We denote, of these two points of intersection, the tilt angle of the intersection at the larger tilt angle as $\theta_H$, and the tilt angle of the intersection at the smaller tilt angle as $\theta_L$. The micromirror attains dynamic equilibrium at the tilt position $\theta_L$.

A rise of the applied voltage V results in an upward shift of the torque characteristic curve. Thus, as the applied voltage V rises, the two intersection points approach each other with an increase in $\theta_L$ and a decrease in $\theta_H$. A further rise of the applied voltage V causes the two intersection points to coincide with each other at $\theta_L=\theta_H=\theta_{MAX}$, i.e., the torque characteristic curve is brought into contact with the hinge spring characteristic line. FIG. 6 represents this situation.

The tilt angle $\theta_{MAX}$ is thus the maximum value of $\theta_L$, i.e., the maximum steering angle within the range of tilt angles in which stable angle positioning is possible.

In the example with the above-described design conditions, when the stiffness of the hinge springs that bear micromirror 203 is set to 32.5×10$^{-10}$ N-m/rad, the maximum value $\theta_{MAX}$ of the mirror tilt angle for the applied voltage 150 V is 5.2 degrees. The maximum tilt angle of mirror frame 303 is of the same level when the stiffness of the hinge springs and the area and position of the electrodes are similarly set, and biaxial drive of the optical device for steering optical signals can thus be realized over the range of ±5.2 degrees.

As described in the foregoing explanation, an analog beam-steering free-space optical switch is required to extend the range of mirror steering $\theta_{MAX}$ in order to be adaptive to a tendency toward scale-up of the switch while suppressing optical loss.

In a biaxial-drive optical device, the angular range $\theta_{MAX}$ for angular positioning of micromirror 203 and mirror frame 303 is limited by restrictions arising from the torque characteristics of the device and elastic characteristics of the parts. Control of the angular positions of micromirror 203 and mirror frame 303 is thus performed within a range of tilt angles limited by these restrictions.

Thus, in order to extend the range of micromirror steering of an analog beam-steering free-space optical switch, the electrostatic actuator must be designed to extend the maximum controllable tilt angle $\theta_{MAX}$.

When the maximum steering angle (maximum controllable tilt angle) of an optical device is set larger, however, the air gap must be increased to avoid electrostatic breakdown caused by contact between the micromirror and the electrode at a large tilt angle. Increasing the air gap while keeping the driving voltage fixed, however, lowers the torque characteristic curve and causes a problem that the obtainable maximum tilt angle becomes smaller.

Since lowering the torque characteristic curve, however, has the advantage of relieving a sharp rise in torque at large steering angles, the maximum controllable tilt angle $\theta_{MAX}$ can be extended if the stiffness of the hinge springs is designed to be soft. Reducing the stiffness of the hinge spring, however, brings about the risk of a break during processing, complicates handling of the components, and further, reduces the response speed of the optical device and leads to switching delay.

The easiness of manufacture and the fast response can be guaranteed despite increasing the air gap if the applied voltage is raised while maintaining the stiffness of the hinge springs above a prescribed fixed value. However, increasing the applied voltage brings about an sharp rise in driving torque with respect to the variation of the tilt angle θ. As a result, the sharp rise characteristic of driving torque causes a decrease of the maximum tilt angle $\theta_{MAX}$. A high-voltage drive may also cause a loss in circuit reliability. In large-scale switches in particular, in which severe conditions are imposed regarding the arrangement of electrode wiring, the high-voltage drive increases the probability of the occurrence of problems such as parasitic discharge in narrow gaps between wiring.

It is an object of the present invention to provide an analog beam-steering free-space optical switch that allows an improvement in the controllability of steering angles with respect to electrostatic driving torque and that is capable of steering an optical signal in an extended range of steering angle by means of a low-voltage drive. It is another object of the present invention to provide an analog beam-steering free-space optical switch that is suitable to large-scale switches and that offers small size, high speed, low cost, and high reliability.

SUMMARY OF THE INVENTION

To achieve the above-described objects, the present invention adopts the basic construction described below.

The optical switch according to the present invention is an optical switch for connecting and switching optical paths of a plurality of optical signals and includes a plurality of optical devices and electrostatic actuators for driving these devices.

The optical devices are each pivotally borne so as to allow rotation around a prescribed center of rotation. The electrostatic actuator includes a substrate that holds the optical devices and a plurality of driving electrodes mounted on the substrate.

An electrostatic voltage, when applied between the optical devices and driving electrodes, generates an electrostatic driving torque for causing the optical device to tilt with respect to the substrate around the center of rotation.

Control of the electrostatic driving torque allows control of the tilt of the optical device around the center of rotation and changes the direction of reflection of optical signals.

In the first optical switch of the present invention, a plurality of driving electrodes are arranged in a radial pattern with respect to the electrode center, and each driving electrode is formed in a shape in which the electrode width of a prescribed outer portion thereof with respect to the electrode center narrows with progression toward the outside. Here, the electrode center is the orthogonal projection of the center of rotation onto the substrate surface.

Since the width of the electrodes thus decreases with progression toward the outer circumference of the driving electrodes, the electrostatic driving torque that is applied to the outer circumferential portion of the micromirror is reduced compared to the prior art even when the same electrostatic driving voltage is applied. Thus, since a decrease in the electrostatic attractive force caused by narrowing of the width of the driving electrode compensates for an increase in the electrostatic attractive force caused by an increase in the tilt angle, a steep rise of the electrostatic driving torque in a large steering angle region is relaxed.

As a result, it becomes possible to set the maximum tilt angle $\theta_{MAX}$ to a large value thereby enabling large tilt-angle control while preventing possible collisions between the micromirror and the substrate caused by an accidental increase in the tilt angle when operating in a large steering angle.

The optical device has a micromirror, a mirror frame arranged to surround the circumference of the micromirror, and a frame arranged to surround the circumference of the mirror frame. The micromirror is pivotally borne by the mirror frame such that the micromirror can rotate around a first rotational axis and such that an elastic restoring force acts against this rotation. The mirror frame is also pivotally borne by the frame such that the mirror frame can rotate around a second rotational axis and such that an elastic restoring force acts against this rotation.

The first rotational axis and the second rotational axis intersect each other on a plane parallel to the substrate. This point of intersection therefore makes the center of rotation of the optical device.

The plurality of driving electrodes can include a first electrode pair and a second electrode pair: a first electrode pair generates electrostatic driving torque for causing the micromirror to rotate around the first rotational axis; and a second electrode pair generates electrostatic driving torque for causing the mirror frame to rotate around the second rotational axis.

The two electrodes of the first electrode pair are arranged on both sides of a first orthogonal plane and the two electrodes of the second electrode pair are arranged on both sides of a second orthogonal plane. Here, the first orthogonal plane is a plane that includes the first rotational axis and that is perpendicular to the substrate. The second orthogonal plane is a plane that includes the second rotational axis and that is perpendicular to the substrate.

In the case of biaxial drive, the first rotational axis and the second rotational axis are arranged orthogonal to each other.

In the first optical switch, each of the driving electrodes is formed in a shape such that the electrode width of a prescribed inner portion with respect to the center of the electrode narrows with progression toward the inside.

As a result, in a biaxial-drive optical device, the pair of electrodes for rotating the micromirror and the pair of electrodes for rotating the mirror frame can each be extended into the vicinity of the electrode center without causing geometric interference. As a result, a large electrostatic driving torque can be generated with a low driving voltage, and the electrostatic driving torque can be set to a high value in the region of small steering angles.

The first optical switch can include an embodiment in which each of the driving electrodes is formed in a shape such that the electrode width of a prescribed inner portion with respect to the electrode center narrows with radially inward progression, and moreover, is formed in a shape such that the electrode width of a prescribed outer portion with respect to the electrode center narrows with radially outward progression.

In this embodiment, the electrostatic driving torque characteristic curve shifts upward as a whole because the driving electrodes are extended toward the inside with respect to the electrode center, but the electrostatic driving torque characteristic curve shifts downward because the electrode width of the driving electrodes narrows with radially outward progression with respect to the electrode center. This downward shift is more conspicuous with larger tilt angles. Accordingly, in comparison with the prior art, the shape of the driving electrodes in this embodiment produces an electrostatic driving torque characteristic in which the electrostatic driving torque characteristic curve is shifted upward in the tilt-angle range where the tilt angle is small and the electrostatic driving torque characteristic curve is shifted downward in the tilt-angle range where the tilt angle is large. Thus, this electrostatic driving torque characteristic curve exhibits a characteristic that rises more gradually with increase in the tilt angle than the characteristic curve of the prior art.

As a technical advantage of this embodiment, the range, within which the tilt angle can be controlled, extends, i.e., the maximum controllable tilt angle increases, as described below:

As previously explained, within the range in which tilt angles are not particularly large, the electrostatic driving torque characteristic curve for the tilt angle of the present embodiment is shifted up from that of the prior art. As a result, the slope or gradient of a tangent line that is drawn from the origin to the electrostatic driving torque characteristic curve is larger than the slope of a tangent line in the prior art;

generally, when a fixed voltage is applied between the micromirror and driving electrodes to generate an electrostatic driving torque, this torque increases monotonically with increase in the tilt angle of the micromirror. However, the rate of change of this torque increases as the tilt angle increases (i.e., the electrostatic driving torque characteristic curve rises more sharply with increase in the tilt angle);

accordingly, even if the gradient of the electrostatic driving torque characteristic curve of the present embodiment were exactly the same as that of the prior art, the tilt angle coordinates in the point of contact of the tangent line would be larger in the present embodiment than in the prior art, because the gradient of the torque characteristic curve at the point of contact of the tangent line is larger in this embodiment than in the prior art; and since the tilt angle coordinate at the point of contact of the tangent line represents the maximum controllable steering angle, as explained above, the electrode configuration of this embodiment causes the maximum controllable tilt angle to be increased.

This embodiment offers an advantage of providing a shorter response time than the prior art technique as well, because the slope of the tangent line, drawn from the origin to the electrostatic driving torque characteristic curve, corresponds to an elastic constant of the elastic member. Since the slope of the tangent line is larger in the present embodiment than in the prior art, the present embodiment enables to employ an elastic member of a high elastic constant, which causes a short response time.

In this way, it can be achieved to extend the range of steering angles, employing low-voltage drive while increasing the elastic constant of the elastic member of the pivotal bearing portion (for example, a hinge spring). A compact, low-cost, and highly reliable high-speed optical switch applicable to large-scale switches can thus be provided.

As one working example, the driving electrodes can each be formed in a rhombus shape. The shape of each driving electrode may also be formed as an oval shape having its major axis aligned with a radial direction relative to the electrode center.

An optical switch may be constituted by arranging optical devices and electrostatic actuators, as described in the foregoing explanation, in an array depending on the number of input and output ports.

The second embodiment of the optical switch of the present invention is an optical switch for connecting and switching optical paths of a plurality of optical signals and includes a plurality of optical devices and electrostatic actuators for driving these optical devices, wherein the optical devices are pivotally borne to allow rotation around a prescribed center of rotation.

Each of the optical devices is provided with: a micromirror, a mirror frame that is arranged to surround the circumference of the micromirror, and a frame arranged to surround the circumference of the mirror frame. The micromirror is pivotally borne by the mirror frame by means of elastic members such as hinge springs such that the micromirror can rotate around a first rotational axis and such that elastic restoring force acts against the rotation.

The mirror frame is pivotally borne by the frame such that the mirror frame can rotate around a second rotational axis and such that elastic restoring force acts against the rotation. The first rotational axis and the second rotational axis intersect each other in the plane that is parallel to the substrate, the point of intersection making the center of rotation of the optical device.

The electrostatic actuator includes the substrate that holds the optical device and a plurality of driving electrodes mounted on the substrate. The plurality of driving electrodes include a first electrode pair for generating electrostatic driving torque for causing the micromirror to rotate around the first rotational axis, and a second electrode pair for generating electrostatic driving torque for causing the mirror frame to rotate around the second rotational axis. Electrostatic voltages, when applied between the micromirror and the first and second driving electrodes, generate electrostatic driving torque for causing the micromirror to tilt with respect to the substrate around the center of rotation. Connecting and switching of optical paths is thus realized by changing the direction of reflection of optical signals.

In this embodiment, the first electrode pair is a pair of circular-segment electrodes of the same size having a central angle of approximately 180 degrees, the two electrodes being arranged concentric with the electrode center and confronting each other on both sides of a first orthogonal plane, this first orthogonal plane including the first rotational axis and extending perpendicular to the substrate surface. The second electrode pair is a pair of concentric circular-segment electrodes of the same size having a central angle of approximately 180 degrees. The two electrodes are arranged concentric with the electrode center and confronting each other on both sides of a second orthogonal plane, the second orthogonal plane including the second rotational axis and extending perpendicular to the substrate surface. The first electrode pair is arranged concentric with the second electrode pair and inside the second electrode pair with respect to the electrode center.

Wiring for supplying a power supply to each electrode of the first electrode pair is provided in the gap that extends between the confronting ends of the second electrode pair.

The micromirror of the optical device is preferably pivotally borne by the first hinge springs on the first rotational axis, and the mirror frame is preferably pivotally borne by the second hinge springs on the second rotational axis. In this case, the tilt stiffness of the second hinge springs is set stiffer than the tilt stiffness of first hinge springs.

Further, the ratio of the tilt stiffness of the first hinge springs to the tilt stiffness of the second hinge springs is preferably set to equal the ratio of the electrostatic driving torque to be generated by the first electrode pair to the electrostatic driving torque to be generated by the second electrode pair when the same driving voltage is applied between the first and second driving electrode pairs and the micromirror.

An optical switch is formed by arranging optical devices and electrostatic actuators depending on the number of input and output ports in an array form.

The above-described electrode configuration of an optical switch enables one pair of electrodes for rotating a micromirror and one pair of electrodes for rotating a mirror frame to be efficiently arranged to cover the largest possible electrode area in an effective electrode region on the substrate that confronts the micromirror.

In addition, the circular-segment electrode shape, in which the essential electrode width narrows toward an outward direction with respect to the electrode center, i.e., toward the outer circumference of the above-described effective electrode region, allows the electrostatic driving torque to be set to high values in the region of small steering angles, as with the optical switch of the above-described first embodiment; and further, enables suppression of too strong electrostatic force generated at tilt angle positions at which the micromirror and the electrodes approach, thereby allowing a suppression of steep rises in electrostatic driving torque.

In this case, taking into account the fact that the area of the electrodes for driving the mirror frame arranged in the outer circumference of the electrodes for driving the micromirror is larger than the area of the latter electrodes, the tilt stiffness of the hinge springs for pivotally bearing the mirror frame is set to be stiffer than the tilt stiffness of the hinge springs for pivotally bearing the micromirror in order to realize proper performance of steering control of the micromirror. This structure has the advantage of avoiding coupled tilt movement of the micromirror and mirror frame and therefore enables an improvement of the control of the micromirror.

Thus, as with the optical switch of the previously described first embodiment, this embodiment enables an extension of the range of the steering angle that is controllable under low-voltage drive while improving the stiffness of the hinge springs of the pivotal bearing portions, thereby enabling to provide an accurate optical switch applicable to large-scale switches.

The above and other objects, features, and advantages of the present invention will become apparent from the following description referring to the accompanying drawings, which illustrate examples of preferred embodiments of the present invention.

DETAILED DESCRIPTION OF THE PREFERRED EMBODIMENTS

Details regarding embodiments of the optical switch of the present invention are next described while referring to the figures.

Figure 7:
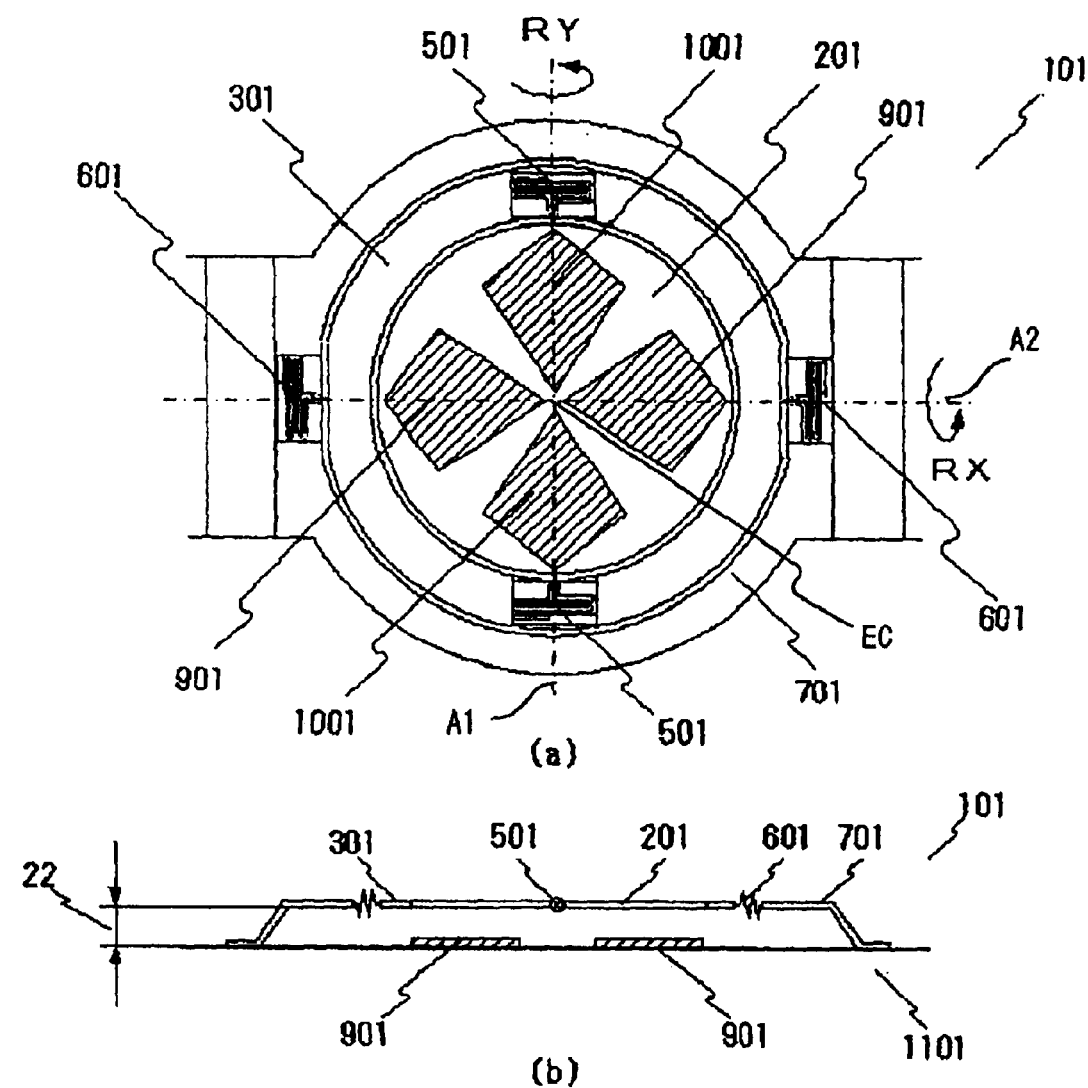
FIG. 7 is a plan view and a side view showing the construction of an optical switch according to the first embodiment of the present invention.
Figure 8:
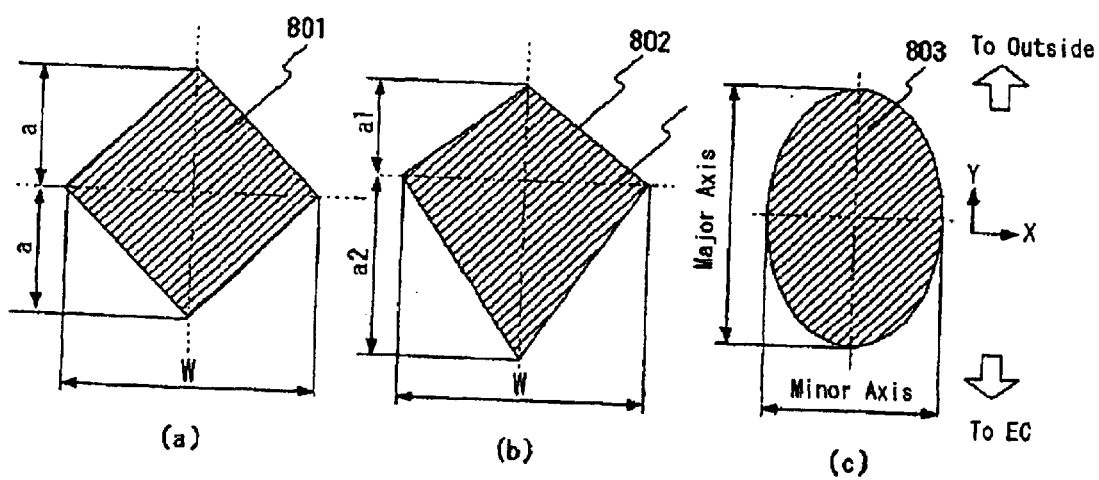
FIG. 8 is a plan view showing shapes of electrodes in the first embodiment of the present invention.
Figure 9:
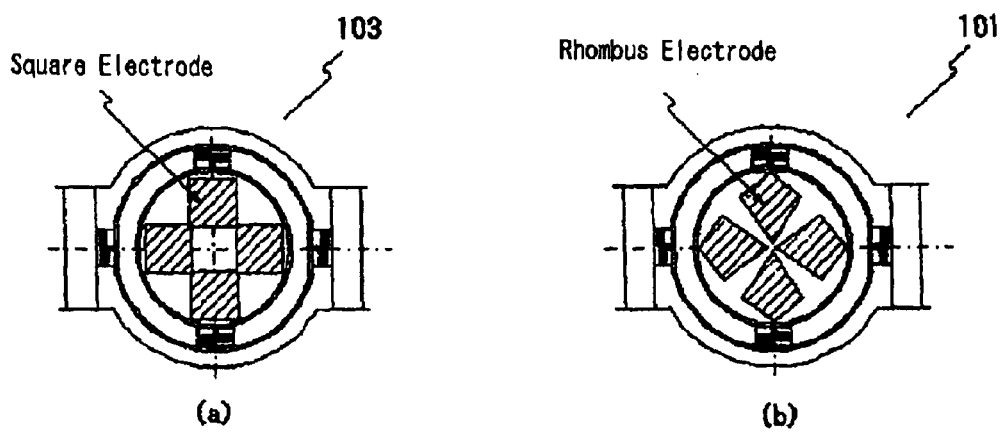
FIG. 9 is a graph showing the driving torque characteristic of the optical switch in the first embodiment of the present invention.
Figure 9:
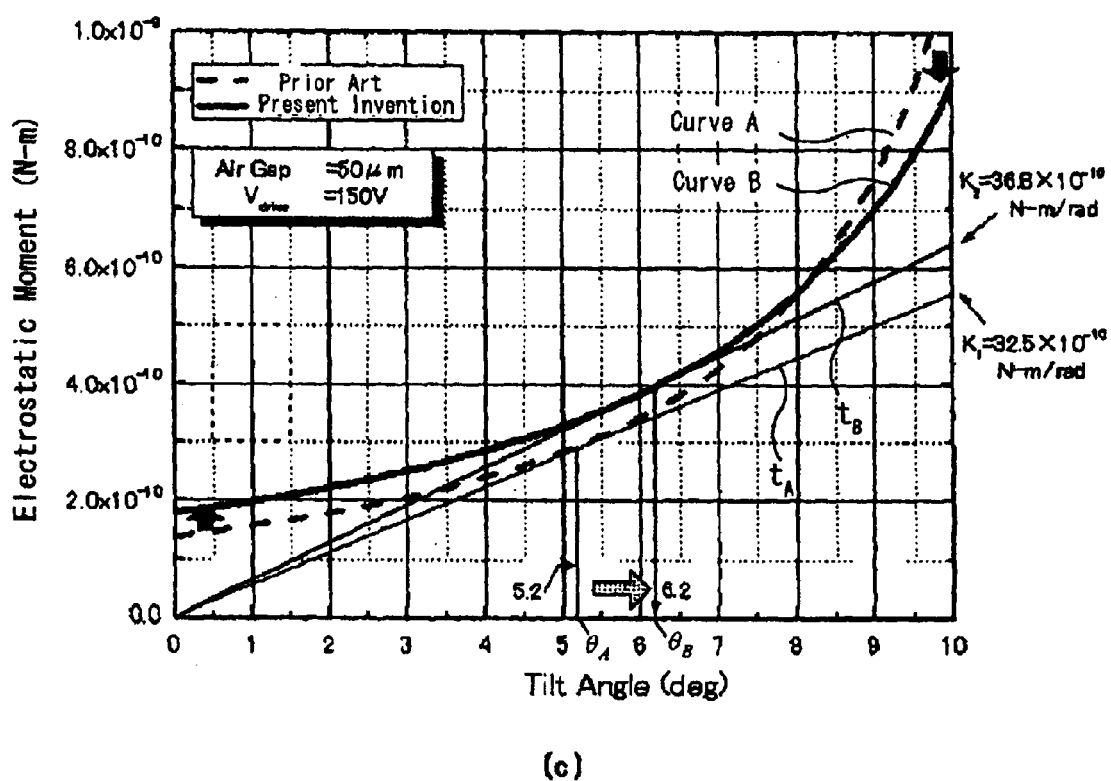

We refer first to FIG. 7, in which is shown the configuration of the optical switch of the first embodiment of the present invention, FIG. 7(a) showing a plan view and FIG. 7(b) showing a side view. FIG. 8 is a plan view showing examples of the shape of the electrodes in this embodiment. FIG. 9 is a graph showing the driving torque characteristic of the optical switch in this embodiment.

An optical switch of this embodiment comprises an optical device and an electrostatic actuator for driving this optical device, and performs connecting and switching of a plurality of optical signal paths. The optical device is borne so as to allow rotation around one or more directions. The electrostatic actuator comprises the substrate that holds the optical device and driving electrodes secured on the substrate. The driving electrodes are arranged radially around the electrode center. Each electrode is formed in a shape such that the electrode width of a prescribed outer portion decreases with progression in an outward direction from the electrode center.

In this embodiment, the optical device is pivotally borne so as to allow rotation around two directions, i.e., around two intersecting rotational axes A1 and A2. In the following description, the intersection of the two rotational axes is referred to as the center of rotation. In addition, the orthogonal projection of the center of rotation onto the substrate surface is referred to as the electrode center (EC). Further, the plane that is perpendicular to the substrate surface and that contains rotational axis A1 is referred to as a first orthogonal plane, and the plane that is perpendicular to the substrate surface and that contains rotational axis A2 is referred to as a second orthogonal plane. Finally, the lines on which the first orthogonal plane and the second orthogonal plane intersect with the substrate surface are referred to as the first and second orthogonal projection axes, respectively.

The optical device includes micromirror 201, mirror frame 301 arranged to surround the circumference of micromirror 201, and frame 701 arranged to surround the circumference of mirror frame 301. Micromirror 201 is pivotally borne by mirror frame 301 by means of a pair of first hinge springs 501, and is elastically borne such that micromirror 201 can rotate around rotational axis A1 (RY direction) of FIG. 7. Mirror frame 301 is elastically and pivotally borne by frame 701 by means of a pair of second hinge springs 601 such that mirror frame 301 can rotate around rotational axis A2 (RX direction), which is orthogonal to rotational axis A1 of the micromirror.

The electrostatic actuator comprises substrate 1101 that holds the optical device and driving electrodes 901 and 1001 mounted on substrate 1101. Driving electrode 901 has two driving electrodes that are formed on both sides of the first orthogonal plane. Driving electrode 1001 has two driving electrodes that are formed on both sides of the second orthogonal plane.

Prescribed outer portions of driving electrodes 901 and 1001 as viewed from the electrode center are formed such that the electrode width W narrows with progression outward from the electrode center (refer to portion a of FIG. 8(a) and portion a1 of FIG. 8(b)).

In the present embodiment, the inner portions of driving electrodes 901 and 1001 as viewed from the electrode center are formed such that electrode width W narrows with progression toward the center of rotation EC of the optical device. The above-described two sets of driving electrodes are arranged on the substrate within the areas of orthogonal projection of the micromirror.

The pair of driving electrodes 901 (hereinbelow referred to as the first electrode pair) is formed to lie on both sides of the first orthogonal plane, whereby the electrostatic force generated by the first electrode pair generates torque that causes the micromirror to rotate around rotational axis A1. Similarly, driving electrode 1001 (hereinbelow referred to as the second electrode pair) is formed to lie on both sides of the second orthogonal plane, whereby electrostatic force generated by the second electrode pair generates torque that causes the micromirror to rotate around rotational axis A2 through mirror frame 301. Rotational axis A1 and rotational axis A2 are established in a mutually orthogonal relation, and the two electrode pairs 901 and 1001 can therefore generate torque around any rotational axis within the plane that contains rotational axis A1 and rotational axis A2 (biaxial drive).

A prescribed electrode separation (air gap) 22 is provided between the driving electrodes and the center of rotation of the optical device, the optical device being grounded. Application of a driving voltage to each of the electrode pairs generates electrostatic attraction between the grounded optical device and the driving electrodes, and causes micromirror 201 and mirror frame 301 to rotate around each rotational axis, thereby reflecting an incident optical signal toward any direction.

In the present embodiment, each driving electrode is formed in a novel shape. The driving electrode shown in FIG. 7(a) takes the shape such that electrode width W of the inner portions as seen from electrode center (the portions that are close to the electrode center) decreases with inward progression toward the electrode center, while at the same time, the electrode width W of the outer portions decreases with outward progression from the electrode center. The driving electrodes of FIG. 7(a) are thus formed in a rhombus shape.

FIG. 8 shows other embodiments of the electrode shape in the optical switch of the present invention.

FIG. 8(a) shows an equilateral rhombus-shaped electrode, FIG. 8(b) shows an electrode in which the position of maximum electrode width of the rhombus-shaped electrode has been shifted outward (in the direction away from the electrode center) from that of the rhombus-shaped electrode of FIG. 8(a) (a1<a2).

FIG. 8(c) shows an electrode in which the electrode shape has been set as an oval. Each electrode pair of this shape is formed such that the major axis coincides with the orthogonal projection axis. In this case as well, each electrode is formed such that the electrode width decreases with progression toward the electrode center, while at the same time the electrode width decreases with progression outward relative to the electrode center. The same effect can therefore be achieved regarding the electrostatic driving torque characteristic as with the above-described rhombus-shaped electrodes. Since the dimensions of the major axis and minor axis are optimized according to the design parameters of the optical device and electrostatic actuator, the shape of the electrodes may in some cases be set as a circle.

Thus, the shape of the electrodes can be optimally designed in accordance with the limits of the design parameters of the optical device or with the demands of the driving voltage circuits.

Forming the electrodes such that the electrode width of portions close to the electrode center decreases in this way allows an extension of first electrode pair 901 and second electrode pair 1001 as far as the vicinity of the electrode center without causing geometrical interference. As a result, the areas of the electrodes can be increased, and higher torque can be generated for the same mirror tilt angle than in the prior art, at the same applied voltage. Thus, the inward extension of the electrode areas causes an upward shift of the electrostatic driving torque-versus mirror tilt angle characteristic curve.

FIG. 9 is a graph showing the driving torque characteristic of the optical switch in the first embodiment of the present invention, FIG. 9(a) showing the electrostatic driving electrodes of the prior art and FIG. 9(b) showing the rhombus-shaped electrostatic driving electrodes of this embodiment. FIG. 9(c) shows the results of calculating the electrostatic driving torque characteristic versus mirror tilt angle $\theta$. The broken-line in the figure represents the electrostatic driving torque characteristic curve when using the electrostatic driving electrodes of the prior art shown in FIG. 9(a), and the solid-line curve represents the electrostatic driving torque characteristic curve when using the rhombus-shaped electrostatic driving electrodes of FIG. 9(b). The straight lines in upward slanting directions from $\theta=0$ are lines representing the elastic restoring force of the hinge springs as a function of mirror tilt angle $\theta$. The slope (or gradient) of each of these lines represents the stiffness of the hinge spring.

Figure 6:
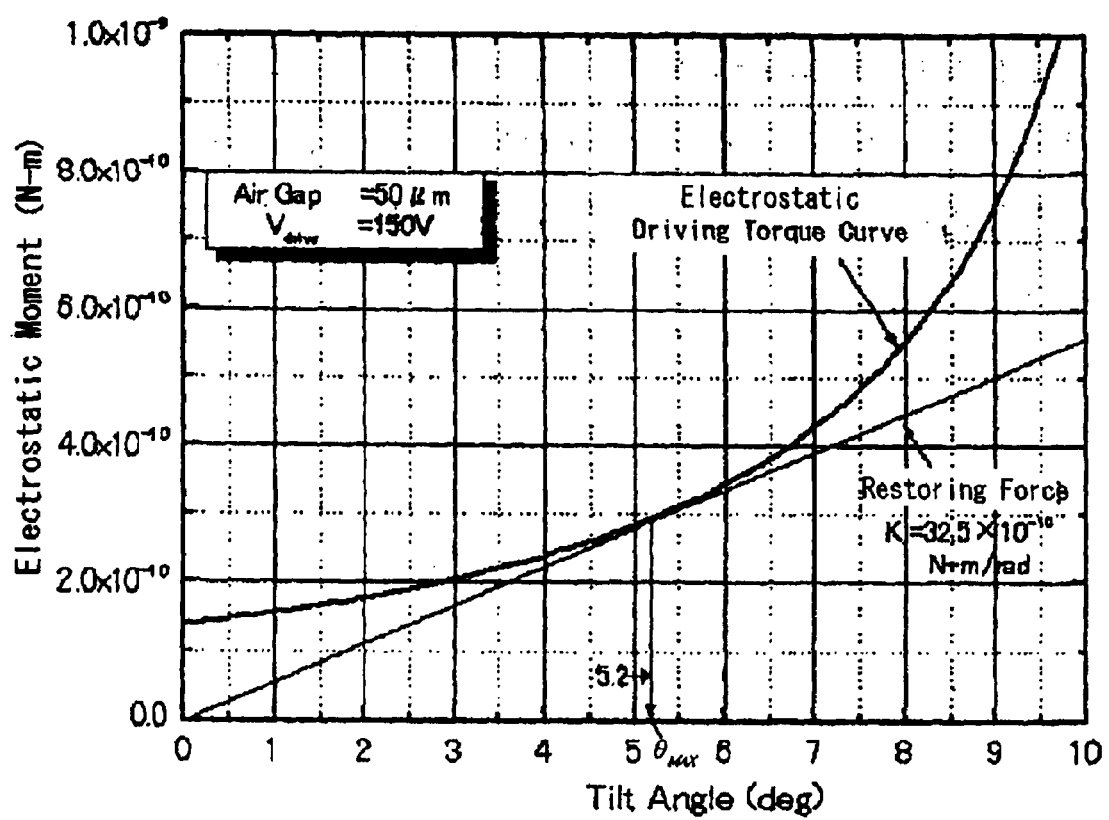
FIG. 6 is a graph showing the driving torque characteristic of the optical switch according to the second example of the prior art.

The conditions for setting the parameters of the calculation of FIG. 9 are the same as for the model shown in FIG. 6.

The electrode portion that extends as far as the vicinity of the electrode center produces an additive electric field E' in the vicinity of rotational axes A1 and A2 (x<<L). Change in E', however, is slight despite changes in the mirror tilt angle $\theta$ (Since change in $\alpha$, $\Delta\alpha=-x \Delta\theta$, is slight despite change in $\theta$ in the range of x where x is small, and change in electrostatic field E' is also small (see equation (2))). As a result, the contribution of electrostatic field E' to the electrostatic driving torque characteristic is substantially uniform over the range in which the mirror tilt angle $\theta$ is controllable ($\theta=0$ through $\theta=\theta_{MAX}$). In FIG. 9(c), the upward arrow inserted in the small $\theta$ region represents the electrostatic torque increment caused by the additive electrostatic field E'.

In the present embodiment, the width W of the driving electrodes gradually narrows with progression toward the outside as viewed from the electrode center, as previously described. This shape results in a circumferential area of an electrode smaller than that of the prior art, and the electrostatic driving torque therefore lowers. However, the rate of decrease in the electrostatic driving torque increases as the mirror tilt angle $\theta$ increases.

The reason for this is as follows: Since the electric field E" produced by the outward tapered electrode portions is the electric field at a position remote from rotational axes A1 and A2 (x≈L), the value of distance $\alpha$ decreases as the mirror tilt angle $\theta$ increases ($\alpha \approx d-(L\theta)$). As is clear from Formula (2) and Formula (3), the electrostatic driving torque per unit electrode area is inversely proportional to $a^2$. On this account, the electrostatic driving torque per unit electrode area increases more rapidly as mirror tilt angle $\theta$ increases.

This means that the effect of outward narrowing of the electrode area is greater with increase in the mirror tilt angle $\theta$. The rate of decrease of the electrostatic driving torque as a function of the electrode area is therefore greater at a large tilt angle than at a small tilt angle.

The downward arrow inserted in the region where the tilt angle $\theta$ is large in FIG. 9(c) represents the amount of decrease.

The electrode width W that is set so as to decrease with outward progression thus suppresses a sharp rise in the electrostatic driving torque-versus-tilt angle characteristic even in the region of large steering angles where the edge of the mirror approaches the driving electrodes and electrode separation (air gap) 22 becomes small.

In addition, since the electrode width W is set to decrease with inward progression toward the electrode center to lift the electrostatic driving torque characteristic curve in the region of small steering angles, the initial electrostatic driving torque can be set high in the region of small steering angles at a start of driving.

Compared to the electrostatic driving torque characteristic for the square electrodes (or rectangular electrodes) of the prior art, the electrostatic driving torque characteristic for the driving electrodes of this embodiment is as follows:

The initial torque of the movable mirror (the electrostatic driving torque in the region of small tilt angles) rises (upward arrow in FIG. 9(c)), and moreover, a rise in the electrostatic driving torque plotted against the tilt angle are suppressed (downward arrow in FIG. 9(c)).

This rise in the electrostatic driving torque in the region of small tilt angles and the suppression of the rise in the region in which the mirror tilt angle $\theta$ is large mean that the electrostatic driving torque characteristic curve of the present embodiment (solid line) varies more gradually than that of the prior art (broken line). The mirror steering angle $\theta$ can therefore be controlled with higher resolution.

As can be seen from FIG. 9(c), the gradient of the electrostatic driving torque characteristic curve of this type of micromirror, whether in the optical switch of the present invention or in the optical switch of the prior art, generally increases as the mirror tilt angle $\theta$ increases. This phenomenon indicates the following two facts:

1) The mirror tilt angle $\theta$ is large at points having a large gradient on the electrostatic driving torque characteristic curve. In FIG. 9(c), curve B (solid line) is pushed upward above curve A (solid line) in the region in which the mirror tilt angle $\theta$ is not large. Accordingly, when tangent lines are drawn from the origin to these curves, the gradient of tangent $t_B$ to curve B is larger than the gradient of tangent $t_A$ to curve A. For this reason, mirror tilt angle $\theta_B$ that corresponds to the point of contact on curve B is larger than mirror tilt angle $\theta_A$ corresponding to the point of contact on curve A. Thus, when the same voltage is applied between the micromirror and the driving electrodes, the maximum value $\theta_{MAX}$ of the range of controllable mirror tilt angles is larger for this embodiment than for that of the prior art.

In addition, the fact that the slope of a tangent line drawn from the origin to electrostatic driving torque characteristic curve in the present embodiment is steeper than in the prior art indicates that the hinge springs of high stiffness can be employed in the device of the present embodiment.

2) Mirror tilt angles θ for which the electrostatic driving torque characteristic curves have the same gradient are larger on an electrostatic driving torque characteristic curve that rises gradually than on a curve that rises sharply. Accordingly, if a straight line having a particular slope is drawn from the origin and the voltage between the micromirror and driving electrodes is then regulated such that the electrostatic driving torque characteristic curve contacts this line, the electrostatic driving torque characteristic curve of the present embodiment will contact this line at a larger mirror tilt angle θ than in the prior art. This fact indicates that, even when using hinge springs that have the same stiffness, the maximum value $\theta_{MAX}$ of the region of controllable mirror tilt angles in the present embodiment is larger than that of the prior art.

Thus, the present embodiment allows the range of the steering angle (the tilt angle at the contact point of a tangent from the origin and the driving torque curve) for which stable positioning is possible to be extended. In the embodiment of FIG. 9, the steering angle is extended from $\theta_A$=5.2 degrees (prior art) to $\theta_B$=6.2 degrees (present embodiment). Further, the hinge spring stiffness (tilt stiffness) can be designed to be stiffer, from $K_1$=32.5×10$^{-10}$ N-m/rad (prior art) to $K_2$=36.8×10$^{-10}$ N-m/rad (present embodiment). As a result, an optical switch can be provided in which the mirror steering angle is extended without reducing the response speed of the movable mirror. A compact, low-cost, highly reliable, and high-speed optical switch that is suitable for large-scale applications can therefore be provided.

Figure 1:
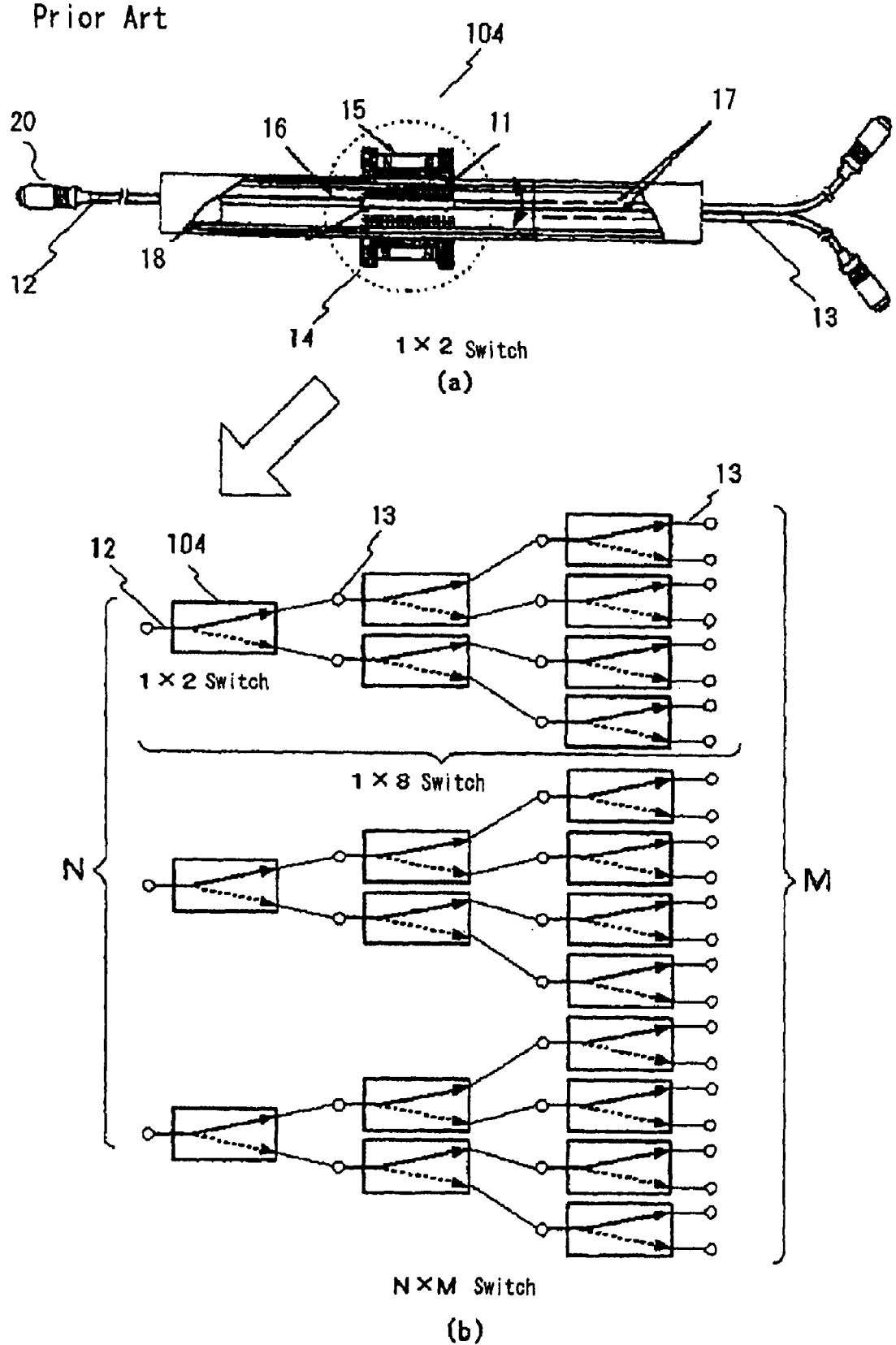
FIG. 1 is a structural view showing an optical switch according to the first example of the prior art.
Figure 2:
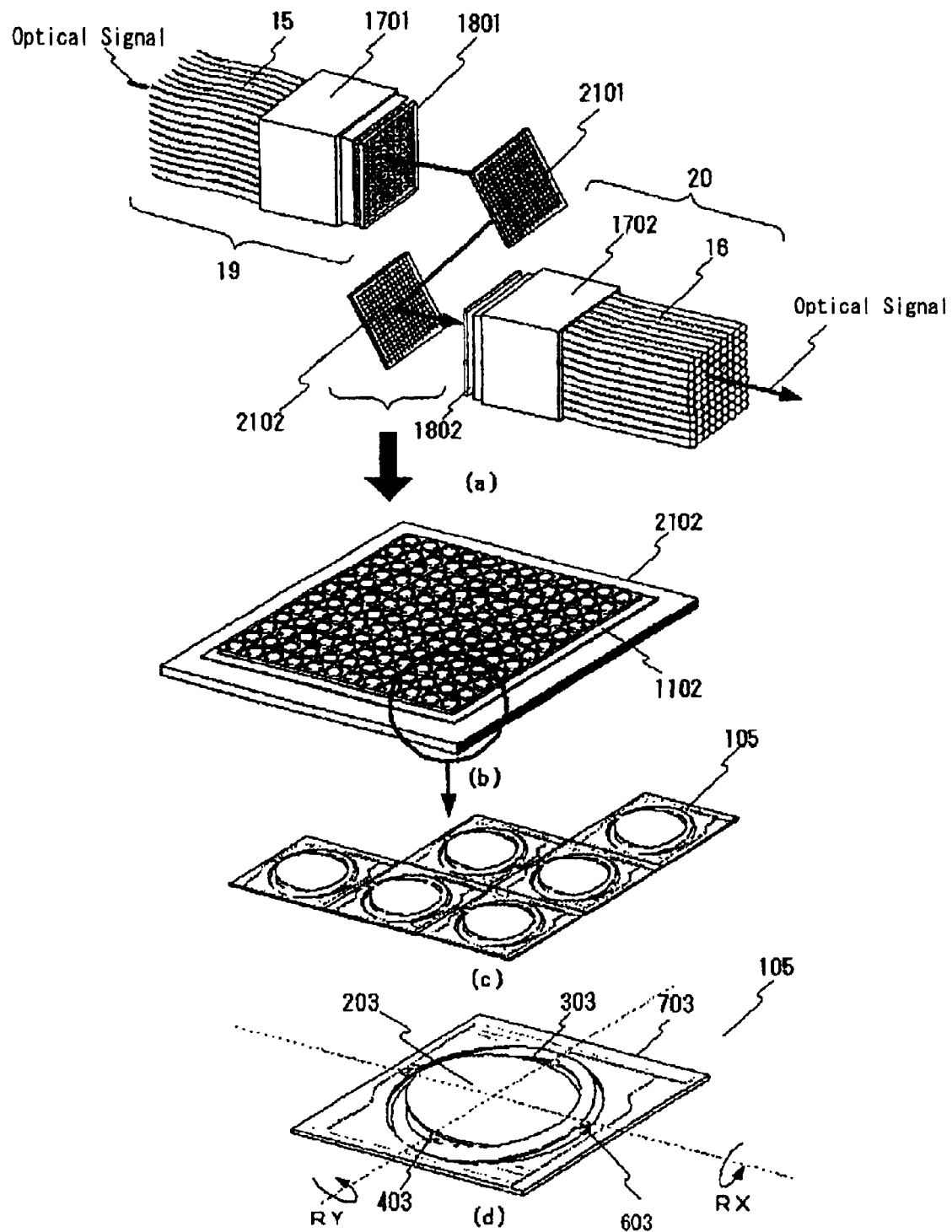
FIG. 2 shows an example of a large-scale all-optical optical switch of the prior art.
Figure 3:
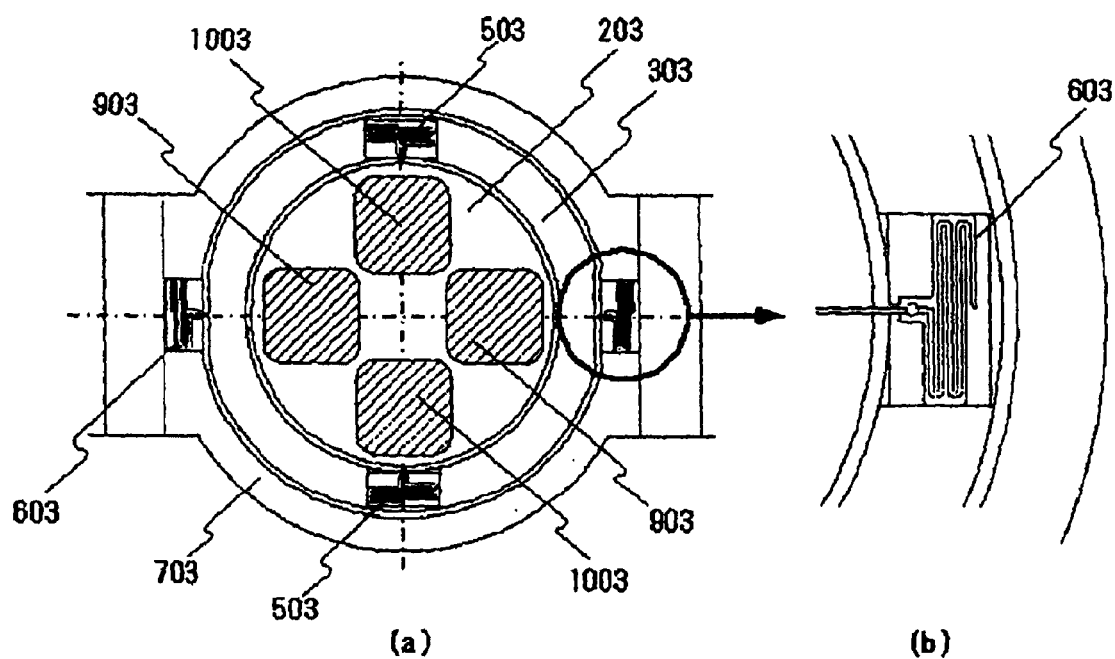
FIG. 3 is a plan view showing the optical device of the optical switch according to the second example of the prior art.
Figure 4:
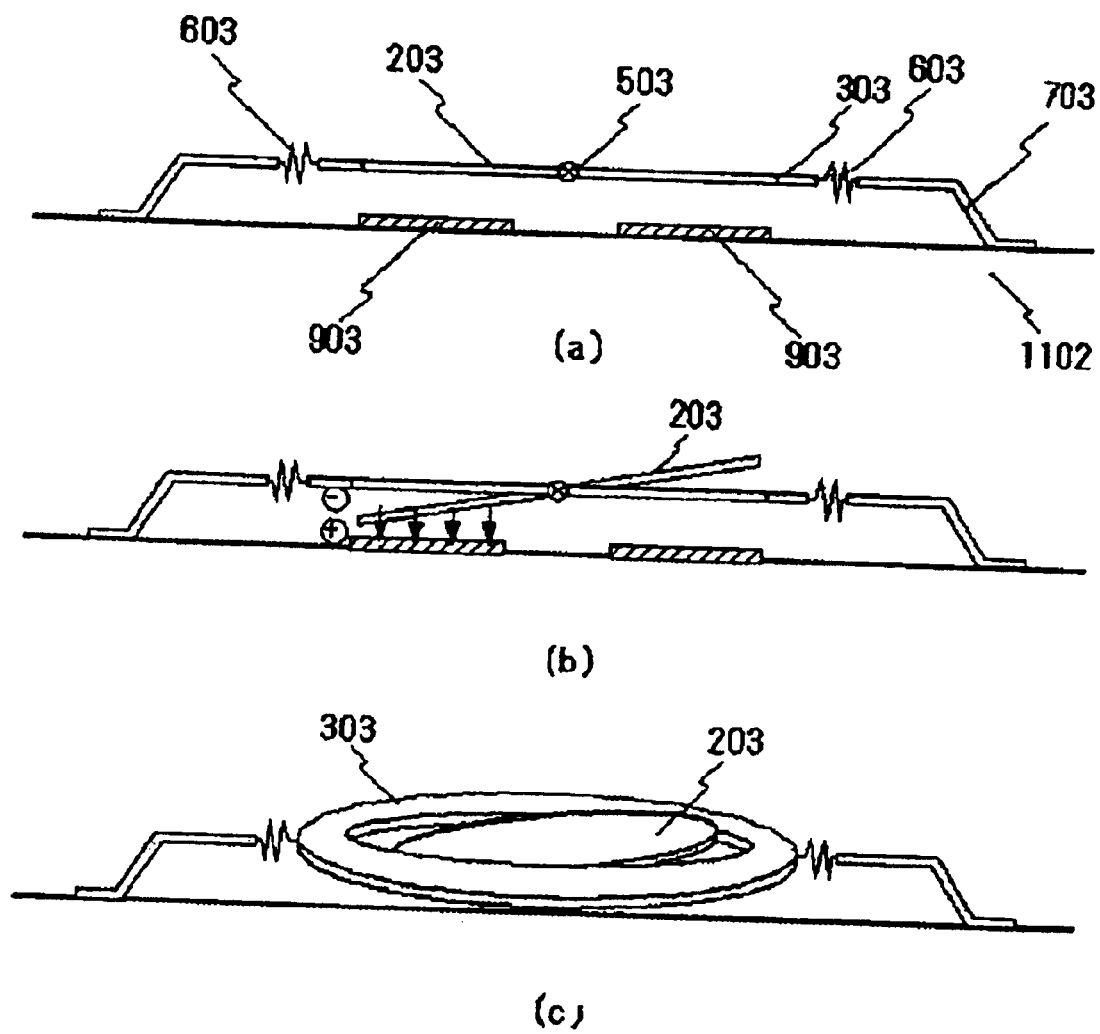
FIG. 4 shows diagrams illustrating the principle of operation of the optical switch according to the second example of the prior art.
Figure 5:
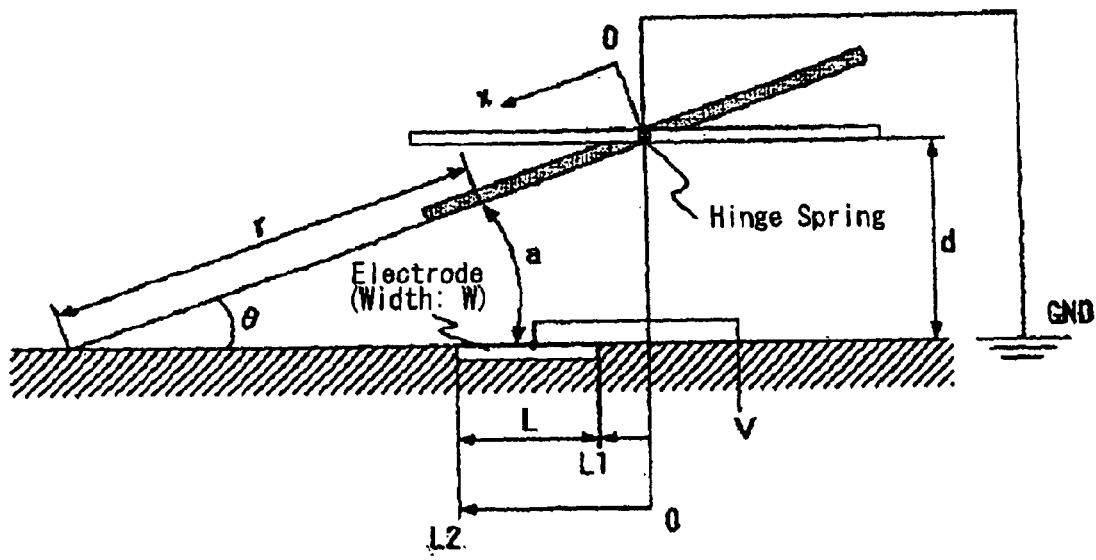
FIG. 5 is a side view showing an analysis model of a mirror that rotates around an axis.

The optical switch in the present embodiment is amenable to processing in which MEMS technology is applied. For example, a multiplicity of optical switches can be arranged in matrix form on a silicon wafer and modularized (refer to the prior-art example of FIG. 2(b)); and input/output fiber arrays can be combined with collimation lens arrays to constitute a large-scale optical switch module (refer to the prior-art example of FIG. 2(a)).

Further, although an electrostatic actuator was constructed by affixing driving electrodes to the substrate and grounding the optical device in the previously described embodiment, a construction may also be adopted in which the driving electrodes are arranged on the optical device and the substrate is grounded. Further, although the structure of the hinge spring portion in the present embodiment was set to a serpentine shape as was shown in the prior-art example, any structure capable of obtaining the prescribed stiffness may be employed.

Explanation next regards the second embodiment of the optical switch of the present invention. The optical switch of this embodiment as well is directed to connecting and switching optical paths of a plurality of optical signals and is provided with optical devices and electrostatic actuators that drive these optical devices.

The optical device is provided with: a circular micromirror, a substantially concentric circular mirror frame arranged to surround the circumference of the micromirror, and a frame arranged to surround the circumference of the mirror frame. The rotational axis of the micromirror (hereinbelow referred to as rotational axis A1) passes through a diameter of micromirror 202. The rotational axis of the mirror frame (hereinbelow referred to as rotational axis A2) passes through a diameter of the mirror frame that is orthogonal to rotational axis A1.

The micromirror is pivotally borne by the mirror frame by means of first hinge springs, and the mirror frame is pivotally borne by the frame by means of second hinge springs such that the mirror frame can rotate around an axis that is orthogonal to rotational axis A1 of the micromirror.

The electrostatic actuator is provided with the substrate that holds the optical device and driving electrodes that are affixed on the substrate. The driving electrodes are provided with a first electrode pair for causing the micromirror to rotate and a second electrode pair for causing the mirror frame to rotate.

The first electrode pair is constituted by a pair of circular-segment electrodes each having a central angle of approximately 180 degrees and having the same size. The two end edges of each of the circular-segment electrodes of the first electrode pair are arranged to confront the two end edges of the other circular-segment electrode on both sides of the first orthogonal plane.

The second electrode pair is a pair of concentric circular-segment electrodes each having a central angle of approximately 180 degrees, and the two end edges of each of the concentric circular-segment electrodes are arranged to confront the two end edges of the other concentric circular-segment electrode on both sides of the second orthogonal plane.

The first electrode pair is located radially inward of the second electrode pair with respect to the electrode center. The second electrode pair is thus arranged in a position that is rotated 90 degrees with respect to the first electrode pair.

Figure 10:
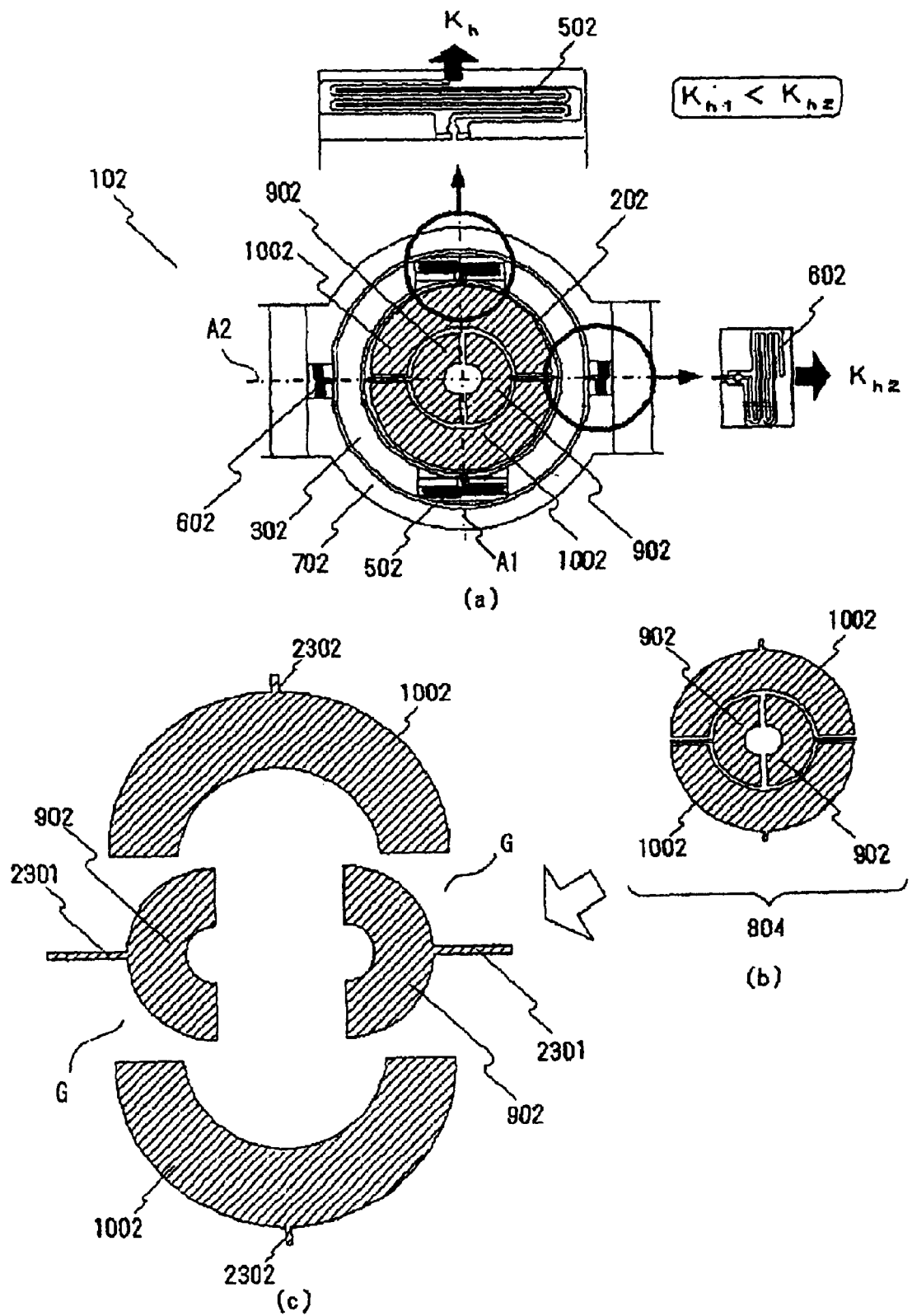
FIG. 10 is a plan view showing the configuration of an optical switch according to the second embodiment of the present invention.

Details of the present embodiment are next described with reference to FIG. 10.

FIG. 10(a) is a plan view showing the configuration of the optical switch that represents the present embodiment, and FIGS. 10(b) and (c) are plan views showing the shapes of the electrodes in this embodiment.

The optical switch of this embodiment is also constituted by an optical device and an electrostatic actuator for driving the optical device, and performs connection and switching of optical paths of a plurality of optical signals.

The constitution of the optical device is similar to that of the previously described first embodiment, and is provided with micromirror 202, mirror frame 302, and frame 702.

Mirror frame 302 is arranged to surround the circumference of micromirror 202. Frame 702 is arranged to surround the circumference of mirror frame 302. Micromirror 202 is pivotally borne by mirror frame 302 by means of first hinge springs 502. Mirror frame 302 is pivotally borne by frame 702 by means of second hinge springs 602 such that mirror frame 302 can rotate around rotational axis A2 orthogonal to rotational axis A1 of micromirror 202.

The electrostatic actuator is provided with the substrate that holds the optical device and driving electrodes 902 and 1002 affixed onto the substrate.

The driving electrodes are constituted by first electrode pair 902 for rotating micromirror 202 and second electrode pair 1002 for rotating mirror frame 302. The first electrode pair is arranged such that the two end edges of each of the pair of circular-segment electrodes 902, each having a central angle of approximately 180 degrees, confront the two end surfaces of the other circular-segment electrode on both sides of the first orthogonal plane.

The second electrode pair is arranged with each of the pair of concentric circular-segment electrodes 1002, each having a central angle of approximately 180 degrees, confronting each other on both sides of the second orthogonal plane, which contains rotational axis A2 of mirror frame 302. First electrode pair 902 is arranged surrounded by and inward of second electrode pair 1002 as viewed from the electrode center. Second electrode pair 1002 is thus arranged at a position that is rotated 90 degrees with respect to first electrode pair 902.

Finally, electrode wiring lines 2301 of the two circular-segment electrodes of first electrode pair 902 are led to the external of the substrate such that the lines pass through gap G between the confronting edges of the two concentric circular-segment electrodes of second electrode pair 1002 (see FIG. 10(c)).

A prescribed electrode separation (air gap) is provided between driving electrodes 902 and 1002 and the optical device, and the application of a voltage to either electrode of each of the first and second electrode pairs generates electrostatic force (attraction) and thus steers the movable mirror to perform steering of an optical signal.

In addition, the tilt stiffness Kh2 of second hinge springs 602 that pivotally bear mirror frame 302 is set to be larger than the tilt stiffness Kh1 of first hinge springs 502 that pivotally bear micromirror 202.

This setting is for compensating for the difference in electrostatic force caused by the difference in the areas of the electrodes and thereby improving the control of the micromirror. The ratio of the tilt stiffness Kh1 to tilt stiffness Kh2 is set to equal the ratio of the electrostatic torque generated by first electrode 902 to the electrostatic torque generated by second electrode 1002 when the same voltage is applied.

The adoption of this electrode structure and hinge spring stiffness allows the electrodes for driving the micromirror and the electrodes for driving the mirror frame to be efficiently arranged in the largest possible area of the electrode within the effective region of the substrate that confronts the micromirror. Furthermore, narrowing the essential electrode width (the electrode width that generates electrostatic driving force) with outward progression relative to the electrode center allows suppression of a steep rise in the electrostatic driving torque characteristic curve plotted against a tilt angle, as in the first embodiment. As a result, the range of the steering angle in which control is possible at low-voltage drive can be extended, and an optical switch applicable to a large-scale switch can be provided.

At the same time, the tilt stiffness of the hinge spring portion that bears the mirror frame is set to a larger stiffness than that of the micromirror depending on the difference in electrostatic driving torque between the micromirror and mirror frame. As a result, the occurrence of vibrations possibly generated when rotation of the movable mirror around the two axes couples can be avoided, and further, controllability of the steering angle can be improved.

The optical device and driving electrodes in the optical switch of the present embodiment are also amenable to processing using MEMS technology, and as with the previously described first embodiment, a multiplicity of optical switches may be arranged two-dimensionally in matrix form on a silicon chip and combined with a fiber array and lens array to construct a large-scale optical switch module.

Although a construction in which the driving electrodes are mounted on the substrate and the optical device is grounded is described in the present embodiment as well, the same results can be obtained when a construction is adopted in which the driving electrodes are arranged on the optical device and the substrate is grounded. In addition, although the structure of the hinge spring portion is established as a serpentine shape in the present embodiment, this construction is not particularly specified, and any structure that can obtain the prescribed stiffness may be employed.

The present invention has the following technical merits:

In the optical switch of the present invention, the shape of electrodes of the electrostatic actuator to drive the micromirror is set such that the electrode width narrows with progression toward the electrode center, and at the same time, the electrode width also narrows with outward progression relative to the electrode center. This construction not only allows a more appropriate electrostatic driving torque to be obtained at a low driving voltage than in the prior art, but also allows the driving torque characteristic of the micromirror to be improved to have an extended range of controllable steering angles. As a result, a compact, low-cost, highly reliable optical switch suitable for large-scale applications can be provided.

Furthermore, in the optical switch of one embodiment of the present invention, the shape of the electrodes of the electrostatic actuator for driving the micromirror is provideded with two circular-segment electrodes each having a central angle of approximately 180 degrees and placed in mutual confrontation. The electrode pair for driving the micromirror is arranged toward the electrode center, and the electrode pair for driving the mirror frame is arranged outside the electrode pair for driving the micromirror and rotated 90 degrees with respect to the electrode pair for driving the micromirror.

Still further, the tilt stiffness of the elastic members (hinge spring portion) that bear the mirror frame is set larger than the tilt stiffness of the elastic members (hinge spring portion) that bear the micromirror.

This configuration allows an improvement of the driving torque characteristic of the micromirror as well as an improvement of the mirror control, and allows an extension of the range of controllable steering angles at low-voltage drive. As a result, the present invention offers an advantage of providing an accurate optical switch suitable for applications to large-scale optical communication.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. An optical switch for connecting and switching optical paths of a plurality of optical signals, comprising an optical device and an electrostatic actuator for driving said optical device; said optical device being pivotally borne so as to allow rotation around a prescribed center of rotation and said electrostatic actuator including a substrate that holds said optical device and a plurality of driving electrodes mounted on said substrate; wherein an electrostatic voltage that is applied between said optical device and said driving electrodes generates an electrostatic driving torque for causing said optical device to tilt with respect to said substrate around said center of rotation, whereby the direction of reflection of said optical signal is changed; and wherein:

said plurality of driving electrodes are formed in at least two pairs arranged in a single radial pattern around an electrode center, said electrode center being the orthogonal projection of said center of rotation onto said substrate surface; and said plurality of driving electrodes are each formed in a shape in which the electrode width of a prescribed outer portion relative to said electrode center narrows with progression toward the outside, all of said driving electrodes have a same shape.

2. An optical switch according to claim 1, wherein:

said optical device includes a micromirror, a mirror frame arranged to surround the circumference of said micromirror, and a frame arranged to surround the circumference of said mirror frame;

said micromirror is pivotally borne by said mirror frame such that said micromirror can rotate around a first rotational axis and such that an elastic restoring force acts against this rotation;

said mirror frame is pivotally borne by said frame such that said mirror frame can rotate around a second rotational axis and such that an elastic restoring force acts against this rotation;

said first rotational axis and said second rotational axis intersect each other on the plane that is parallel to the substrate, this point of intersection making said center of rotation;

said plurality of driving electrodes include a first electrode pair for generating electrostatic driving torque for causing said micromirror to rotate around said first rotational axis and a second electrode pair for generating electrostatic driving torque for causing said mirror frame to rotate around said second rotational axis;

the two electrodes of said first electrode pair are arranged on both sides of a first orthogonal plane, said first orthogonal plane being a plane that includes said first rotational axis and extends perpendicular to said substrate; and the two electrodes of said second electrode pair are arranged on both sides of a second orthogonal plane, said second orthogonal plane being a plane that includes said second rotational axis and extends perpendicular to said substrate.

3. An optical switch according to claim 2, wherein said first rotational axis and said second rotational axis are mutually orthogonal.

4. An optical switch according to claim 1, wherein each of said driving electrodes is formed in a shape in which the electrode width of a prescribed inner portion thereof with respect to said electrode center narrows with inward progression.

5. An optical switch according to claim 3, wherein each of said driving electrodes is formed in a shape in which the electrode width of a prescribed inner portion thereof with respect to said electrode center narrows with inward progression.

6. An optical switch according to claim 5, wherein the shape of said driving electrodes is a rhombus shape.

7. An optical switch according to claim 5, wherein each of said driving electrodes is an oval having its major axis aligned with a radial direction with respect to said electrode center.

8. An optical switch according to claim 1, wherein a plurality of said optical devices and electrostatic actuators are arranged in an array depending on the number of input and output ports.

9. An optical switch for connecting and switching an optical signal, said optical switch comprising an optical device and an electrostatic actuator for driving said optical device, said electrostatic actuator including a substrate that holds said optical device and a plurality of driving electrodes mounted on said substrate;

said optical device being pivotally borne so as to allow rotation around a prescribed center of rotation; said optical device including a micromirror, a mirror frame arranged to surround the circumference of said micromirror, and a frame arranged to surround the circumference of said mirror frame; said micromirror being pivotally borne by said mirror frame such that said micromirror can rotate around a first rotational axis and such that an elastic restoring force acts against this rotation; said mirror frame being pivotally borne by said frame such that said mirror frame can rotate around a second rotational axis and such that an elastic restoring force acts against this rotation; said first rotational axis and said second rotational axis intersecting each other on the plane that is parallel to the substrate, and this point of intersection making said center of rotation;

said plurality of driving electrodes including a first electrode pair for generating electrostatic driving torque for causing said micromirror to rotate around said first rotational axis and a second electrode pair for generating electrostatic driving torque for causing said mirror frame to rotate around said second rotational axis; and an electrostatic voltage, when applied between said optical device and said first and second driving electrodes, generating an electrostatic driving torque for causing said micromirror to tilt with respect to said substrate around said center of rotation, thereby changing the directions of reflection of the optical signal to perform connection and switching of an optical path of said optical signal; wherein:

said first electrode pair has a pair of circular-segment electrodes of the same size, each having a central angle of approximately 180 degrees, the two electrodes being arranged concentric with an electrode center and confronting each other on both sides of a first orthogonal plane, said electrode center being the orthogonal projection of said center of rotation onto said substrate surface, and said first orthogonal plane being a plane including said first rotational axis and extending perpendicular to the substrate surface;

said second electrode pair has a pair of concentric circular-segment electrodes of the same size, each having a central angle of approximately 180 degrees, the two electrodes being arranged concentric with said electrode center and confronting each other on both sides of a second orthogonal plane, said second orthogonal plane being a plane including said second rotational axis and extending perpendicular to the substrate surface; and said first electrode pair is arranged concentric to said second electrode pair inside said second electrode pair with respect to said electrode center.

10. An optical switch according to claim 9, wherein wiring for each electrode of said first electrode pair extends in the gap that is provided between the confronting edges of said second electrode pair.

11. An optical switch according to claim 9, wherein said micromirror of said optical device is pivotally borne by first hinge springs on said first rotational axis, said mirror frame is pivotally borne by second hinge springs on said second rotational axis, and the tilt stiffness of said second hinge springs is set stiffer than the tilt stiffness of said first hinge springs.

12. An optical switch according to claim 11, wherein the stiffness ratio of the tilt stiffness of said first hinge springs to the tilt stiffness of said second hinge springs is set to equal the ratio of electrostatic driving torque to be generated by said first electrode pair to electrostatic driving torque to be generated by said second electrode pair when equal driving voltage is applied between said micromirror and said first and second driving electrode pairs.

13. An optical switch according to claim 9, wherein a plurality of said optical devices and electrostatic actuators are arranged in array form depending on the number of input and output ports.

14. The optical switch as claimed in claim 9, wherein said second electrode pair are each a single continuous electrode spanning approximately 180°.

* * * * *